(12) United States Patent
Binns et al.

(10) Patent No.: US 6,897,084 B2
(45) Date of Patent: May 24, 2005

(54) CONTROL OF OXYGEN PRECIPITATE FORMATION IN HIGH RESISTIVITY CZ SILICON

(75) Inventors: Martin Jeffrey Binns, St. Charles, MO (US); Robert J. Falster, London (GB); Jeffrey L. Libbert, O'Fallon, MO (US)

(73) Assignee: MEMC Electronic Materials, Inc., St. Peters, MO (US)

( * ) Notice: Subject to any disclaimer, the term of this patent is extended or adjusted under 35 U.S.C. 154(b) by 0 days.

(21) Appl. No.: 10/120,714

(22) Filed: Apr. 11, 2002

(65) Prior Publication Data

US 2003/0054641 A1 Mar. 20, 2003

Related U.S. Application Data

(60) Provisional application No. 60/283,103, filed on Apr. 11, 2001, provisional application No. 60/300,364, filed on Jun. 22, 2001, and provisional application No. 60/371,324, filed on Apr. 10, 2002.

(51) Int. Cl.$^7$ .................. H01L 21/00; H01L 21/335; H01L 21/8223; H01L 21/331; H01L 21/8222
(52) U.S. Cl. .................. 438/58; 438/143; 438/310; 438/471; 438/473; 438/795
(58) Field of Search .................. 438/58, 143, 310, 438/471, 473, 476, 795, 797

(56) References Cited

U.S. PATENT DOCUMENTS

| | | | |
|---|---|---|---|
| 4,548,654 A | 10/1985 | Tobin | 438/471 |
| 4,851,358 A | 7/1989 | Huber | 438/471 |
| 5,024,723 A | 6/1991 | Goesele et al. | 438/459 |
| 5,189,500 A | 2/1993 | Kusunoki | 349/17 |
| 5,327,007 A | 7/1994 | Imura et al. | 257/610 |
| 5,374,564 A | 12/1994 | Bruel | 439/455 |

(Continued)

FOREIGN PATENT DOCUMENTS

| | | |
|---|---|---|
| EP | 0 942 078 A1 | 9/1999 |
| EP | 1 087 041 A1 | 3/2001 |
| JP | 7/321120 | 12/1995 |
| JP | 7/335657 | 12/1995 |
| JP | 11/067781 | 3/1999 |
| JP | 11/150119 | 6/1999 |
| WO | WO 98/45507 A1 | 10/1998 |
| WO | WO 00/08677 A1 | 2/2000 |
| WO | WO 00/77830 A2 | 12/2000 |

OTHER PUBLICATIONS

C. Londos et al. "Effect of Oxygen Concentration on the Kinetics of Thermal Donor Formation in Silicon at Temperatures Between 350 and 500° C." Appl. Phys. Lett., vol. 62, No. 13 (1993) pp. 1525–1526.

W. Kaiser "Electrical and Optical Properties of Heat–Treated Silicon" Physical Review, vol. 105, No. 6 (1957) pp. 1751–1756.

W. Kaiser et al. "Mechanism of the Formation of Donor States in Heat–Treated Silicon" Physical Review, vol. 112, No. 5 (1958) pp. 1546–1554.

N. Cheung "Plasma Immersion Ion Implantation for Semiconductor Processing" Materials Chemistry & Physics, vol. 46 (1996) pp. 132–139.

(Continued)

Primary Examiner—Olik Chaudhuri
Assistant Examiner—William M. Brewster
(74) Attorney, Agent, or Firm—Senniger Powers

(57) ABSTRACT

The present invention is directed to a single crystal Czochralski-type silicon wafer, and a process for the preparation thereof, which has at least a surface layer of high resistivity, the layer having an interstitial oxygen content which renders it incapable of forming thermal donors in an amount sufficient to affect resistivity upon being subjected to a conventional semiconductor device manufacturing process. The present invention further directed to a silicon on insulator structure derived from such a wafer.

24 Claims, 3 Drawing Sheets

U.S. PATENT DOCUMENTS

| | | | | |
|---|---|---|---|---|
| 5,401,669 A | | 3/1995 | Falster et al. | 438/476 |
| 5,403,406 A | | 4/1995 | Falster et al. | 148/2 |
| 5,436,175 A | * | 7/1995 | Nakato et al. | 438/766 |
| 5,502,010 A | | 3/1996 | Nadahara et al. | 438/795 |
| 5,502,331 A | | 3/1996 | Inoue et al. | 297/617 |
| 5,508,207 A | | 4/1996 | Horai et al. | 438/477 |
| 5,539,245 A | | 7/1996 | Imura et al. | 297/610 |
| 5,593,494 A | | 1/1997 | Falster | 117/2 |
| 5,611,855 A | | 3/1997 | Wijaranakula | 117/2 |
| 5,641,353 A | * | 6/1997 | Hara et al. | 117/3 |
| 5,788,763 A | | 8/1998 | Hayashi et al. | 117/2 |
| 5,882,987 A | | 3/1999 | Srikrashnan | 438/458 |
| 5,939,770 A | | 8/1999 | Kageyama | 257/611 |
| 5,944,889 A | | 8/1999 | Park et al. | 117/94 |
| 5,994,761 A | | 11/1999 | Falster et al. | 257/611 |
| 6,180,220 B1 | | 1/2001 | Falster et al. | 438/312.6 |
| 6,190,631 B1 | * | 2/2001 | Falster et al. | 423/438 |
| 6,191,010 B1 | | 2/2001 | Falster | 438/471 |
| 6,204,152 B1 | | 3/2001 | Falster et al. | 438/473 |
| 6,236,104 B1 | * | 5/2001 | Falster | 257/618 |
| 6,245,645 B1 | | 6/2001 | Mitani et al. | 438/455 |
| 6,284,384 B1 | * | 9/2001 | Wilson et al. | 428/450 |
| 6,306,733 B1 | | 10/2001 | Falster et al. | 438/471 |
| 6,336,968 B1 | | 1/2002 | Falster | 117/2 |
| 6,339,016 B1 | | 1/2002 | Torack et al. | 438/584 |
| 6,361,619 B1 | * | 3/2002 | Falster et al. | 148/33.2 |
| 6,432,197 B2 | | 8/2002 | Falster | 117/3 |
| 6,485,807 B1 | | 11/2002 | Park | 428/64.1 |
| 6,537,368 B2 | | 3/2003 | Falster et al. | 117/2 |
| 6,537,655 B2 | * | 3/2003 | Wilson et al. | 428/310.5 |
| 6,544,656 B1 | | 4/2003 | Abe et al. | 428/446 |
| 6,579,779 B1 | | 6/2003 | Falster | 438/471 |
| 6,586,068 B1 | | 7/2003 | Falster et al. | 428/64.1 |
| 6,666,915 B2 | | 12/2003 | Yang et al. | 117/3 |
| 6,669,777 B2 | | 12/2003 | Kononchuk et al. | 117/36 |
| 6,673,147 B2 | | 1/2004 | Kononchuk et al. | 117/13 |
| 2001/0032581 A1 | * | 10/2001 | Wilson et al. | 117/20 |
| 2002/0170631 A1 | * | 11/2002 | Falster et al. | 148/33.3 |
| 2002/0179006 A1 | | 12/2002 | Borgini et al. | 117/95 |

OTHER PUBLICATIONS

M. Claybourn et al. "Thermal Donor Formation and the Loss of Oxygen From Solution in SIlicon Heated at 450° C" Appl. Phys. Lett., vol. 52, No. 25 (1988) pp. 2139–2141.

Abe et al. "High Resistivity CZ Silicon for RF Applications Substituting GaAs" Electrochem. Soc. Proc., vol. 2000–17, pp. 491–500.

Abe et al. "Defect–Free Surfaces of Bulk Wafers by Combination of RTA and Crystal Growth Conditions" (publication information unknown).

Abe et al. "Innovated Silicon Crystal Growth and Wafering Technologies" Electrochemical Soc. Proceedings, vol. 97–3 (1997) pp. 123–133.

Chiou "The Effects of Preheatings on Axial Oxygen Precipitation Uniformity in Czochralski Silicon Crystals" J. Electrochem. Soc., vol. 139, No. 6 (Jun. 1992) pp 1680–1684.

Claybourn et al. "Thermal Donor Formation and the Loss of Oxygen From Solution in Silicon Heated at 450° C." Appl. Phys. Lett., vol. 52, No. 25 (1988) pp. 2139–2141.

Jacob et al. "Influence of RTP on Vacancy Concentrations" Mat. Res. Soc. Symp. Proc., vol. 490 (1998) pp. 129–134.

Pagani et al. "Spatial Variations on Oxygen Precipitation in Silicon After High Temperature Rapid Thermal Annealing" Appl. Physl. Lett., vol. 70, No. 12 (Mar. 1997) pp. 1572–1574.

Zimmermann et al. "Gold and Platinum Diffusion: The Key to the Understanding of Intrinsic Point Defect Behavior in Silicon" Appl. Phys. A., vol. 55 (1992) pp. 121–134.

Zimmermann et al. "Investigation of the Nucleation of Oxygen Precipitates in Czochralski Silicon at an Early Stage" Appl. Phys. Lett., vol. 60, No. 26 (1992) pp. 3250–3252.

Zimmermann et al. "The Modeling of Platinum Diffusion in Silicon Under Non–Equilibrium Conditions" J. Electrochem. Soc., vol. 139, No. 1 (1992) pp. 256–262.

Zimmerman et al. "Vacancy Concentration Wafer Mapping in Silicon" J. Crystal Growth, vol. 129 (1993) pp. 582–592.

* cited by examiner

CONTROL OF OXYGEN PRECIPITATE FORMATION IN HIGH RESISTIVITY CZ SILICON

CROSS REFERENCE TO RELATED APPLICATIONS

This application claims the benefit of U.S. Provisional Application Ser. Nos. 60/283,103 filed Apr. 11, 2001 and 60/300,364 filed Jun. 22, 2001, as well as U.S. Provisional Application 60/371,324, by M. Binns et al. entitled "Process for Controlling Denuded Zone Depth in an Ideal Oxygen Precipitating Silicon Wafer" filed Apr. 10, 2002, all of which are incorporated herein by reference.

BACKGROUND OF THE INVENTION

The present invention generally relates to the preparation of a semiconductor material substrate, especially a silicon wafer, which is suitable for used in the manufacture of electronic components. More particularly, the present invention relates to a silicon wafer, and a process for the preparation thereof, which has a surface layer of high resistivity, the layer having an interstitial oxygen content which renders it incapable of forming thermal donors in an amount sufficient to affect resistivity upon being subjected to a conventional semiconductor device manufacturing process. The present invention further relates to a silicon on insulator structure derived from such a wafer.

Single crystal silicon, which is the starting material for most processes for the fabrication of semiconductor electronic components, is commonly prepared with the so-called Czochralski (CZ) process wherein a single seed crystal is immersed into molten silicon and then grown by slow extraction. Molten silicon is contaminated with various impurities, among which is mainly oxygen, during the time it is contained in a quartz crucible. At the temperature of the silicon molten mass, oxygen comes into the crystal lattice until it reaches a concentration determined by the solubility of oxygen in silicon at the temperature of the molten mass and by the actual segregation coefficient of oxygen in the solidified silicon. Such concentrations are greater than the solubility of oxygen in solid silicon at temperatures typical for the processes for the fabrication of electronic devices. As the crystal grows from the molten mass and cools, therefore, the solubility of oxygen in it decreases rapidly, whereby in the remaining slices or wafers, oxygen is present in supersaturated concentrations.

Thermal treatment cycles which are typically employed in the electronic device manufacturing processes can cause the precipitation of oxygen in silicon wafers which are supersaturated in oxygen. Depending upon their location in the wafer and their relative size, the precipitates can be harmful or beneficial. Small oxygen clusters are electrically active thermal donors and can reduce resistivity regardless of location in the wafer. Large oxygen precipitates located in the active device region of the wafer can impair the operation of the device but when located in the bulk of the wafer, however, are capable of trapping undesired metal impurities that may come into contact with the wafer during, for example, device fabrication processes. This is commonly referred to as internal or intrinsic gettering ("IG").

Certain applications, such as advanced wireless communication applications, require silicon wafers of relatively high resistivity. For example, conventional advanced wireless communication applications require silicon wafers having a resistivity of greater than 100 ohm cm, and certain advanced applications require resistivities of greater than about 1000 ohm cm. Traditionally, silicon grown by the floating zone (FZ) method has been used for high resistivity applications instead of silicon grown by the Czochralski (CZ) method because of its inherent higher purity. In addition, the relatively high levels of $O_i$ present in CZ silicon, typically in the range of 10–15 parts per million atomic or "ppma," can be problematic. Although the presence of interstitial oxygen can be beneficial for intrinsic gettering purposes, the formation of electrically active thermal donors in the device layer, due to the agglomeration of interstitial oxygen into small clusters in the temperature range of 300–500° C. (temperatures commonly employed in device manufacturing processes), can be a major problem for high resistivity applications since the final steps of device processing involves the formation of alloys between the metal layers and silicon in this temperature range. Resistivity may be negatively impacted by small oxygen clusters located in the active device region, as well as in the wafer bulk. Conversely, the formation of relatively large oxygen clusters in the wafer bulk at temperatures greater than about 500° C. can be beneficial because the large precipitates do not significantly degrade wafer resistivity, and can provide a site for internal gettering.

The formation of thermal donors is generally not problematic in low resistivity wafers because the residence time in the 300–500° C. temperature range is relatively short (typically about one to two hours), and the majority carriers, introduced in n-type or p-type doping, will normally dominate. For high resistivity applications where the added dopant concentration is low, however, the formation of thermal donors in the device processing steps is a major factor in final wafer resistivity. (See, e.g., W. Kaiser et al, *Phys. Rev.*, 105, 1751, (1957), W. Kaiser et al, *Phys. Rev.*, 112, 1546, (1958), Londos et al *Appl. Phys. Lett.*, 62, 1525, 1993.) Thus, for high resistivity CZ applications, residual interstitial oxygen concentration will strongly influence the rate of thermal donor formation during device processing. For example, a wafer having an initial resistivity of about 1000 ohm cm (p-type) and a residual interstitial oxygen concentration of about 13 parts per million atomic ("PPMA") immediately prior to the final low temperature alloy sintering steps will, after typical alloy sintering conditions of about 450° C. for about one hour, form about $10^{14}$ $cm^{-3}$ thermal donors. The resistivity of the wafer would first increase and then "flip" to n-type as thermal donors are generated, assuming that each thermal donor generated behaves as a double donor. (See, e.g., M. Claybourn and R. C. Newman; *Appl. Phys. Lett.* 52, 2139, 1988.) As a result, the final resistivity of the wafer is approximately two orders of magnitude less than the initial resistivity. Conversely, if the initial interstitial oxygen concentration was only about 5 PPMA, the thermal donor concentration after the same 450° C., one hour, anneal would be about $2 \times 10^{12}$ $cm^{-3}$ and the resistivity would remain at about 1000 ohm cm.

Abe et al. reported a process for the preparation of high resistivity CZ crystals. (See, e.g., *Electrochemical Society Proceedings*, vol. 2000-17, 491–500.) In the reported process, CZ crystals were annealed at 650° C. for 2 hours for oxygen nucleation, then at 800° C. for 4 hours for nucleation growth, and then at 1000° C. for 16 hours for oxygen precipitation. Such long periods and associated expense can be prohibitive. Furthermore, this process was reported to be ineffective for crystals with oxygen concentrations of less than about 16 ppma. It is also known that the nucleation rate at 650° C. is strongly influenced by the initial oxygen concentration and therefore the precipitate density is likely to vary from wafer to wafer. In addition, it is likely that pre-existing oxygen precipitates formed during crystal growth will grow during the 4 hr 800° C.+16 hr 1000° C. anneal. This is the so called "thermal history effect" which requires elimination by subjecting the wafers to an additional high temperature anneal thus adding additional complexity and cost to the process.

Accordingly, a need exists for a silicon wafer, and an efficient and reliable process for the preparation thereof, which is capable of internal getting and which has a high resistivity denuded zone, the denuded zone therefore not being capable of forming thermal donors in an amount to appreciably affect the resistivity thereof when subjected to a semiconductor device manufacturing process. Such a wafer would be suited for a number of different applications, include the preparation of high resistivity silicon on insulator devices.

SUMMARY OF THE INVENTION

Among the features of the present invention, therefore, is the provision of a single crystal silicon wafer, and a process for the preparation thereof, which has at least a high resistivity surface layer; the provision of such as wafer which, upon being subjected to an oxygen precipitation heat-treatment, has a high resistivity denuded zone and a high density of oxygen precipitates in the bulk for internal gettering; and, the provision of such a wafer which has a low concentration of interstitial oxygen in the surface layer. Further among the features of the present invention is a silicon on insulator device wherein the supporting layer is derived from such a wafer.

Briefly, therefore, the present invention is directed to a wafer sliced from a single crystal silicon ingot grown in accordance with the Czochralski method. The wafer comprises a front surface, a back surface, an imaginary central plane approximately equidistant between the front and back surfaces, a front surface layer which comprises a region of the wafer between the front surface and a distance, $D_1$, measured from the front surface and toward the central plane, and a bulk layer which comprises the imaginary central plane but not the front surface layer. The wafer additionally comprises a non-uniform concentration of crystal lattice vacancies, the concentration of the vacancies in the bulk layer being greater than the concentration of vacancies in the front surface layer, wherein (i) $D_1$ is at least about 5 microns but less than about 30 microns, (ii) the surface layer has a resistivity of greater than about 50 ohm cm, and (iii) upon being subjected to an oxygen precipitation heat-treatment at a temperature in excess of about 700° C., the surface layer has less than about $1 \times 10^7$ cm$^{-3}$ oxygen precipitates while the bulk layer has more than about $1 \times 10^7$ cm$^{-3}$ oxygen precipitates.

The present invention is further directed to a process for preparing a silicon wafer, the wafer being sliced from a single crystal silicon ingot grown in accordance with the Czochralski method and having a front surface, a back surface, an imaginary central plane approximately equidistant between the front and back surfaces, a front surface layer which has a resistivity of greater than about 50 ohm cm and which comprises a region of the wafer between the front surface and a distance, $D_1$, which as measured from the front surface and toward the central plane is greater than about 5 microns but less than about 30 microns, and a bulk layer which comprises the imaginary central plane but not the front surface layer. In the process, a single crystal silicon wafer is heat-treated in a rapid thermal annealer to form crystal lattice vacancies in the front surface layer and in the bulk layer, and then rapidly cooled to form a template for oxygen precipitation.

The present invention is further directed to process for preparing a silicon wafer, the wafer being sliced from a single crystal silicon ingot grown in accordance with the Czochralski method, the wafer having an interstitial oxygen concentration of less than about 10 ppma, a front surface, a back surface, an imaginary central plane approximately equidistant between the front and back surfaces, a front surface layer which has a resistivity of greater than about 50 ohm cm and which comprises a region of the wafer between the front surface and a distance, $D_1$, which as measured from the front surface and toward the central plane is greater than about 5 microns but less than about 30 microns, and a bulk layer which comprises the imaginary central plane but not the front surface layer. In this process, the single crystal silicon wafer is heat-treated to form crystal lattice vacancies in the front surface layer and in the bulk layer, and the heat-treated wafer is cooled to form a non-uniform vacancy concentration profile in which the peak vacancy concentration is in the bulk layer.

The present invention is further directed to silicon on insulator ("SOI") structures prepared from the silicon wafers of the present invention. More specifically, the present invention is directed to a silicon on insulator structure comprising a device layer, a supporting layer and an insulating layer there between. The supporting layer comprises (A) a first stratum and a second stratum, the first stratum (i) having a greater resistivity than the second stratum, (ii) extending from the insulating layer to the second stratum, and (iii) having a thickness, $T_1$, as measured from the insulating layer to the second stratum, and (B) a non-uniform concentration of crystal lattice vacancies, the concentration of the vacancies in the second stratum being greater than the concentration of vacancies in the first stratum, wherein (a) $T_1$ is at least about 5 microns but less than about 30 microns, (b) the first stratum has a resistivity of greater than about 50 ohm cm, and (c) upon being subjected to an oxygen precipitation heat-treatment at a temperature in excess of about 700° C., the first stratum has an oxygen precipitate density of less than about $1 \times 10^7$ cm$^{-3}$ while the second stratum has an oxygen precipitate density of greater than about $1 \times 10^7$ cm$^{-3}$.

The present invention is still further directed to a silicon in insulator structure comprising a silicon wafer, sliced from a single crystal silicon ingot grown in accordance with the Czochralski method. The wafer has (i) a front surface, a back surface, an imaginary central plane approximately equidistant between the front and back surfaces, (ii) a surface stratum which comprises a region of the wafer between the front surface and a distance, D, measured from the front surface and toward the central plane, and which includes a device layer and an insulating layer, the device layer extending from the front surface to the insulating layer, (iii) a bulk stratum which comprises the imaginary central plane but not the first stratum, and (iv) a non-uniform concentration of crystal lattice vacancies, the concentration of the vacancies in the bulk stratum being greater than the concentration of vacancies in the surface stratum, wherein (a) D is at least about 5 microns but less than about 30 microns, (b) the surface stratum has a resistivity of greater than about 50 ohm cm, and (c) upon being subjected to an oxygen precipitation heat-treatment at a temperature in excess of about 700° C., the surface stratum has an oxygen precipitate density of less than about $1 \times 10^7$ cm$^{-3}$ and the bulk stratum has an oxygen precipitate density of greater than about $1 \times 10^7$ cm$^{-3}$.

Other objects and features of this invention will be in part apparent and in part pointed out hereinafter.

DETAILED DESCRIPTION OF THE PREFERRED EMBODIMENTS

Figure 1:
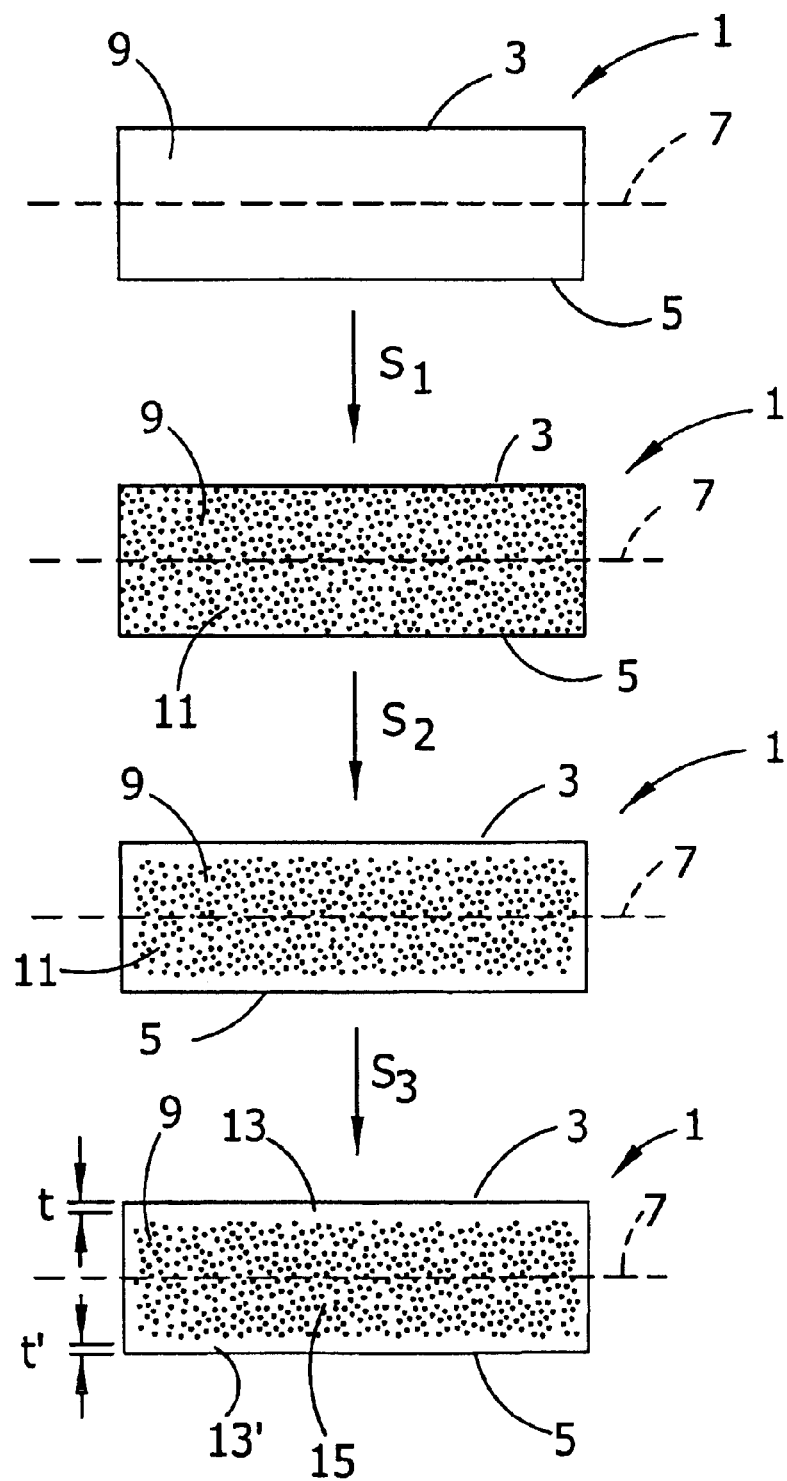
FIG. 1 is a schematic depiction of the present process, wherein a silicon wafer is thermal annealed (S1) and rapidly cooled (S2), in order to obtained a non-uniform distribution of crystal lattice vacancies, and then subjected to an oxygen precipitation heat-treatment (S3) to obtain a wafer having a high resistivity denuded zone of a desired depth.

In accordance with the present invention, a single crystal silicon wafer having a relatively high resistivity and essentially any oxygen content attainable by the Czochralski growth process may be subjected to a thermal treatment and rapid cooling in a controlled atmosphere to obtain a wafer having a distribution of crystal lattice vacancies which establish a template for oxygen precipitation in a subsequent oxygen precipitation heat-treatment for the purposes of suppressing interstitial oxygen concentration so as to avoid the formation of unwanted thermal donors. In one embodiment, the template is for the formation of oxygen precipitates throughout the entire thickness of the wafer. In another, the template enables the formation of a relatively thin denuded zone in the near surface region and oxygen precipitates in the wafer bulk. This process is particularly advantageous because it enables the efficient and reliable production of high resistivity silicon wafers capable of internal gettering, while optionally having a denuded zone with a sufficiently low interstitial oxygen content such that, upon being subjected to device manufacturing processes which commonly lead to the formation of thermal donors (i.e., oxygen clusters), thermal donors do not form in a density or concentration sufficient to substantially alter the resistivity thereof. Accordingly, the present process enables the preparation of silicon wafers particularly well-suited for applications requiring high resistivity substrates.

A. Starting Material

In one embodiment, the starting material for the high resistivity wafer of the present invention is a silicon wafer which has been sliced from a single crystal ingot grown in accordance with conventional Czochralski ("CZ") crystal growing methods, typically having a diameter of about 150 mm, 200 mm, 300 mm or more. The wafer may be polished or, alternatively, lapped and etched but not polished. Such methods, as well as standard silicon slicing, lapping, etching, and polishing techniques are disclosed, for example, in F. Shimura, *Semiconductor Silicon Crystal Technology*, Academic Press, 1989, and *Silicon Chemical Etching*, (J. Grabmaier ed.) Springer-Verlag, New York, 1982 (incorporated herein by reference). Preferably, the wafers are polished and cleaned by standard methods known to those skilled in the art. See, for example, W. C. O'Mara et al., *Handbook of Semiconductor Silicon Technology*, Noyes Publications.

In general, the starting wafer may have an oxygen concentration falling anywhere within the range attainable by the CZ process, which is typically about $5 \times 10^{17}$ to about $9 \times 10^{17}$ atoms/cm$^3$ or about 10 to about 18 PPMA (e.g., about 10 to about 12 or 15 ppma, as determined in accordance with ASTM calibration; $O_i$=4.9 α, where α is the absorption coefficient of the 1107 cm$^{-1}$ absorption band; new ASTM standard F-121-83). In addition, the starting wafer preferably has an absence of stabilized oxygen precipitates (i.e., oxygen precipitates which cannot be dissolved or annealed out of the wafer at a temperature of about 1200° C. or less) in the near-surface region of the wafer.

The starting wafer is also one of relatively high resistivity; that is, it has a resistivity of at least 50 ohm cm and preferably a resistivity of at least about 100 ohm cm. In some embodiments, it will more preferably have a resistivity of at least about 200, 300, 400 or even 500 ohm cm, while in other embodiments it will more preferably have a resistivity of at least 1000, 1500 or even 2000 ohm cm. In general, the preparation of such high resistivity CZ wafers involves the use of high purity components such as crucibles, polysilicon and graphite when the single crystal silicon ingots, from which the wafers are obtained, are grown. In particular, the concentration of impurities such as boron, phosphorus, aluminum, gallium, arsenic, or antimony, which could become electrically active when incorporated into the growing crystal, is preferably carefully controlled to low levels.

B. Creating a Template for Oxygen Precipitation

In general, a rapid thermal treatment is carried out to form a distribution of crystal lattice vacancies which establish a template for oxygen precipitation in the wafer. In one embodiment, the template is for a wafer having oxygen precipitates in the wafer bulk but a low density of, and preferably an essential absence of, oxygen precipitates in a near-surface region; advantageously, denuded zones of any desired depth may be obtained. For example, denuded zone depths of 70 micrometers, 50 micrometers, 30 micrometers, 20 micrometers, or even 10 micrometers or less may be reliably and reproducibly obtained.

The use of a rapid thermal process to form a distribution of crystal lattice vacancies which, in turn, establish a template for oxygen precipitation, is generally described in Falster et al., U.S. Pat. Nos. 5,994,761, 6,191,010 and 6,180,220, all of which are incorporated herein by reference in their entirety. The "ideal precipitating process" described therein typically yields a non-uniform distribution of crystal lattice vacancies, with the concentration in the wafer bulk being higher than in a surface layer. Upon a subsequent, oxygen precipitation heat treatment, the high concentration of vacancies in the wafer bulk form oxygen precipitate nucleation centers which aid in the formation and growth of oxygen precipitates, the concentration of vacancies in the near-surface region being insufficient to do so. As a result, a denuded zone forms in the near-surface region and oxygen precipitates, sometimes referred to as bulk microdefects or simply BMDs, form in the wafer bulk. As described therein, denuded zones of a depth in the range of 50 to 70 micrometers may reliably be formed.

For high resistivity wafers, however, denuded zones of such depth may not always be advantageous. In general, oxygen removal efficiency decreases with increasing denuded zone depth, because the distance over which the interstitial oxygen must travel in order to be removed from solution (either by precipitating at a BMD or by diffusing to the wafer surface) increases. As a result, once a denuded zone becomes too deep or thick (e.g., greater than about 30 microns), there is the potential that the elevated interstitial oxygen concentration in the center of this zone (interstitial oxygen near the surface and bulk of the wafer having sufficient time to diffuse to sites where they are consumed) will be sufficiently high, such that thermal donor formation will occur during a device manufacturing process, thus decreasing resistivity in the device layer of the wafer. This may be particularly problematic in "ideal precipitating wafers" with oxygen concentrations in excess of about 10 ppma. One aspect of the present invention, therefore, is controlling the depth of the denuded zone, which in turn, affects the oxygen removal efficiency in a subsequent oxygen precipitation heat treatment.

The concentration (number density) of oxygen precipitation sites also influences the efficiency of oxygen removal during an oxygen precipitation heat-treatment, the oxygen removal efficiency increasing as a function of an increasing concentration of sites. Advantageously, the concentration of sites increases as a function of increasing rapid thermal annealing temperature; for all practical purposes, the concentration of sites is essentially independent of oxygen concentration (over the range of oxygen concentrations attainable by the CZ process) and time. Stated another way, the concentration of precipitation sites may simply be increased by increasing the rapid thermal annealing temperature and, since a rapid thermal annealer is used, the incremental time required to achieve greater temperatures is a matter of only seconds.

In accordance with the present invention, therefore, thermal donor formation in the denuded zone in a subsequent device fabrication process may be controlled, in part, by selection of a rapid thermal annealing temperature (which determines the concentration of oxygen precipitation sites) and by controlling the thickness of the denuded zone which will form in a subsequent oxygen precipitation heat-treatment. As described in greater detail below, the thickness of the denuded zone may be controlled, in part, by the composition of the ambient selected for the rapid thermal annealing step, and the cooling rate from the temperature of the rapid thermal anneal to temperatures at which crystal lattice vacancies are, as a practical matter, immobile.

In one embodiment, the conditions of the thermal-treatment and cooling are controlled to create a template for the formation of a thin or shallow denuded zone (e.g., a denuded zone of less than about 30 microns). By enabling a thin denuded zone to be obtained, the present process advantageously acts to position the interstitial oxygen therein in close proximity to the wafer bulk and surface, where it may ultimately be consumed. As a result, thermal donor formation can be sufficiently inhibited, thus reproducibly yielding silicon wafers suitable for high resistivity applications (i.e., wafers having at least a surface layer with a resistivity of at least about 50 ohm cm, preferably at least about 100, 200, 300, 400, or 500 ohm cm, and in some instances more preferably at least about 1000, 1500 or even 2000 ohm cm).

Referring now to FIG. 1, the starting material for the present process is a single crystal silicon wafer 1, having a front surface 3, a back surface 5, an imaginary central plane 7 between the front and back surfaces, and a wafer bulk 9 comprising the wafer volume between the front and back surfaces. The terms "front" and "back" in this context are used to distinguish the two major, generally planar surfaces of the wafer; the front surface of the wafer as that term is used herein is not necessarily the surface onto which an electronic device will subsequently be fabricated nor is the back surface of the wafer as that term is used herein necessarily the major surface of the wafer which is opposite the surface onto which the electronic device is fabricated. In addition, because silicon wafers typically have some total thickness variation, warp and bow, the midpoint between every point on the front surface and every point on the back surface may not precisely fall within a plane; as a practical matter, however, the TTV, warp and bow are typically so slight that to a close approximation the midpoints can be said to fall within an imaginary central plane which is approximately equidistant between the front and back surfaces.

In general, in step $S_1$ of the process, the silicon wafer 1 is subjected to a heat-treatment step in which the wafer is heated to an elevated temperature to form and thereby increase the number density of crystal lattice vacancies 11 in wafer 1. Preferably, this heat-treatment step is carried out in a rapid thermal annealer in which the wafer is rapidly heated to a target temperature and annealed at that temperature for a relatively short period of time. In general, the wafer is subjected to a temperature in excess of 1175° C., typically at least about 1200° C. and, in one embodiment, between about 1200° C. and 1300° C. The wafer will generally be maintained at this temperature for at least one second, typically for at least several seconds (e.g., at least 3, 5, etc.) or even several tens of seconds (e.g., at least 20, 30, 40, etc.) and, depending upon the desired characteristics of the wafer and the atmosphere in which the wafer is being annealed, for a period which may range up to about 60 seconds (which is near the limit for commercially available rapid thermal annealers).

Upon completion of the rapid thermal annealing step, the wafer, in step $S_2$, is rapidly cooled through the range of temperatures at which crystal lattice vacancies are relatively mobile in the single crystal silicon, vacancies typically being mobile in silicon within a commercially practical period of time down to temperature in excess of about 700° C., 800° C., 900° C. or even 1000° C. As the temperature of the wafer is decreased through this range of temperatures, some vacancies recombine with silicon self-interstitial atoms and others diffuse to the front surface 3 and back surface 5, thus leading to a change in the vacancy concentration profile with the extent of change depending upon the length of time the wafer is maintained at a temperature within this range. If the wafer were slowly cooled, the vacancy concentration would once again become substantially uniform throughout wafer bulk 9 with the concentration being an equilibrium value which is substantially less than the concentration of crystal lattice vacancies immediately upon completion of the heat treatment step. By rapidly cooling the wafer, however, a non-uniform distribution of crystal lattice vacancies can be achieved, the concentration in the wafer bulk being greater than the concentration in a region near the surface. The cooling rate may be controlled, for example, such that the maximum vacancy concentration is a distance of at least about 20 micrometers, 30 micrometers, 40 micrometers, 50 micrometers or more from the wafer surface. In one embodiment, the maximum vacancy concentration is at or near a central plane 7, the vacancy concentration generally decreasing in the direction of the front surface 3 and back surface 5 of the wafer.

In general, the average cooling rate within the range of temperatures in which vacancies are mobile is at least about 5° C. per second, while in some embodiments the rate is preferably at least about 20° C. per second, 50° C. per second, 100° C. per second or more, with cooling rates in the range of about 100° C. to about 200° C. per being particularly preferred in some instances. In this regard it is to be noted that, once the wafer is cooled to a temperature outside the range of temperatures at which crystal lattice vacancies are relatively mobile in the single crystal silicon, the cooling rate does not appear to significantly influence the precipitating characteristics of the wafer and thus does not appear to be narrowly critical.

The rapid thermal annealing and cooling steps may be carried out in, for example, any of a number of commercially available rapid thermal annealing ("RTA") furnaces in which wafers are individually heated by banks of high power lamps. RTA furnaces are capable of rapidly heating a silicon wafer, for example, from room temperature to about 1200° C. in a few seconds. Additionally, as further described herein below, they may be used to anneal and cool the wafer in a number of different ambients or atmospheres, including those containing oxygen (e.g., elemental oxygen gas, pyrogenic steam, etc.), nitrogen (e.g., elemental nitrogen gas or a nitrogen-contain compound gas such as ammonia), a non-oxygen, non-nitrogen containing gas (e.g., an inert gas like helium or argon), or a mixture or combination thereof.

After an oxygen precipitation heat-treatment step, $S_3$, in which the wafer is annealed, for example, at a temperature of about 800° C. for at least about two hours and then at a temperature of about 1000° C. for about sixteen hours in an oxygen containing atmosphere, the resulting depth distribution of oxygen precipitates in the wafer is characterized by clear regions of oxygen precipitate-free material (precipitate free zones or "denuded zones") 13 and 13' extending from the front surface 3 and back surface 5 to a depth t, t' respectively. Between these oxygen precipitate-free regions, is a precipitation zone 15 containing a substantially uniform density of oxygen precipitates. In general, the density of precipitates will be greater than about $10^8$ and less than about $10^{11}$ precipitates/cm$^3$, with precipitate densities of about $5 \times 10^9$ or $5 \times 10^{10}$ being typical in some embodiments.

The depth t, t' from the front and back surfaces, respectively, of oxygen precipitate-free material (denuded) zones 13 and 13' is, in part, a function of the cooling rate through the temperature range at which crystal lattice vacancies are relatively mobile in silicon. In general, the depth t, t' decreases with decreasing cooling rates, with denuded zone depths of about 10, 20, 30, 40, 50 microns or more (e.g., 70, 80, 90, 100) being attainable. As a practical matter, however, the cooling rate required to obtain shallow denuded zone depths are somewhat extreme and the thermal shock may create a risk of shattering the wafer. Alternatively, therefore, the thickness of the denuded zone may be controlled by selection of the ambient in which the wafer is annealed while allowing the wafer to cool at a less extreme rate. Stated another way, for a given cooling rate, an ambient may be selected which creates a template for a deep denuded zone (e.g., 50+ microns), intermediate denuded zones (e.g., 30–50 microns), shallow denuded zones (e.g., less than about 30 microns), or even no denuded zone. Experience to-date indicates:

1. When a non-nitrogen, non-oxygen containing gas is used as the atmosphere or ambient in the rapid thermal annealing step and cooling step, the increase in vacancy concentration throughout the wafer is achieved nearly, if not immediately, upon achieving the annealing temperature. The vacancy profile of the resulting vacancy concentration (number density) is relatively constant from the front of the wafer to the back of the wafer. Maintaining the wafer at an established temperature for additional time does not appear, based upon experimental evidence obtained to-date, to lead to an increase in vacancy concentration. Suitable gases include argon, helium, neon, carbon dioxide, and other such inert elemental and compound gasses, or mixtures of such gasses.

2. When a nitrogen-containing atmosphere or ambient is used as the atmosphere in the thermal annealing and cooling steps of the first embodiment, vacancy concentration appears to increase as a function of time at an established annealing temperature. The resulting wafer will have a vacancy concentration (number density) profile which is generally "U-shaped" for a cross-section of the wafer; that is, a maximum concentration will occur at or within several micrometers of the front and back surfaces and a relatively constant and lesser concentration will occur throughout the wafer bulk. Hence, the depth of a denuded zone, formed in an oxygen precipitation heat treatment, approaches zero. In addition to nitrogen gas ($N_2$), nitrogen-containing gases such as ammonia are suitable for use.

3. When the atmosphere or ambient in the rapid thermal annealing and cooling steps contains oxygen, or more specifically when it comprises oxygen gas ($O_2$) or an oxygen-containing gas (e.g., pyrogenic steam) in combination with a nitrogen-containing gas, an inert gas or both, the vacancy concentration profile in the near surface region is affected. Experimental evidence to-date indicates that the vacancy concentration profile of a near-surface region bears an inverse relationship with atmospheric oxygen concentration. Without being bound to any particular theory, it is generally believed that, in sufficient concentration, annealing in oxygen results in the oxidation of the silicon surface and, as a result, acts to create an inward flux of silicon self-interstitials. The flux of silicon interstitials is controlled by the rate of oxidation which, in turn, can be controlled by the partial pressure of oxygen in the ambient. This inward flux of self-interstitials has the effect of gradually altering the vacancy concentration profile by causing recombinations to occur, beginning at the surface and then moving inward, with the rate of inward movement increasing as a function of increasing oxygen partial pressure. A region of low vacancy concentration may therefore be created which, following an oxygen precipitation heat treatment, results in a denuded zone of any arbitrary depth suitable for a particular end use of a device which is to be fabricated from the silicon wafer.

In one embodiment, therefore, the atmosphere during the rapid thermal annealing and cooling steps process typically contains an oxygen partial pressure sufficient to obtain a denuded zone depth of less than about 30 microns, and preferably a denuded zone depth ranging from greater than about 5 microns to less than about 30 microns, from about 10 microns to about 25 microns, or from about 15 microns to about 20 microns. More specifically, the annealing and cooing steps of the present process are typically carried out in an atmosphere comprising (i) a nitrogen-containing gas (e.g., $N_2$), (ii) a non-oxygen, non-nitrogen containing gas (e.g., argon, helium, etc.), or (iii) a mixture thereof, and (iv) an oxygen-containing gas (e.g., $O_2$ or pyrogenic steam), the atmosphere having an oxygen partial pressure sufficient to create an inward flux of interstitials (e.g., at least about 1 ppma, 5 ppma, 10 ppma or more) but less than about 500 ppma, preferably less than about 400 ppma, 300 ppma, 200 ppma, 150 ppma or even 100 ppma, and in some embodiments preferably less than about 50, 40, 30, 20 or even 10 ppma. When a mixture of a nitrogen-containing and a non-nitrogen, non-oxygen containing gas is used with the oxidizing gas, the respective ratio of the two (i.e., nitrogen-containing to inert gas) may range from about 1:10 to about 10:1, from about 1:5 to about 5:1, from about 1:4 to about 4:1, from about 1:3 to about 3:1, or from about 1:2 to about 2:1, with ratios of nitrogen-containing gas to inert gas of about 1:5, 1:4, 1:3, 1:2 or 1:1 being preferred in some embodiments. Stated another way, if such a gaseous mixture is used as the atmosphere for the annealing and cooling steps, the concentration of nitrogen-containing gas therein may range from about 1% to less than about 100%, from about 10% to about 90%, from about 20% to about 80% or from about 40% to about 60%.

In this regard it is to be noted that the precise conditions for the annealing and cooling steps may be other than herein described without departing from the scope of the present invention. Furthermore, such conditions may be determined, for example, empirically by adjusting the temperature and duration of the anneal, and the atmospheric conditions (i.e., the composition of the atmosphere, as well as the oxygen partial pressure) in order to optimize the desired depth of t and/or t'.

Regardless of the precise profile, the wafer of the present invention can be said to possess a template for oxygen precipitation well-suited for applications requiring a silicon wafer having at least a surface layer of high resistivity silicon therein. In the high vacancy concentration regions, i.e., the wafer bulk, oxygen clusters rapidly as the wafer is subjected to an oxygen precipitation heat-treatment. In the low vacancy concentration regions, i.e., the near-surface regions, however, the wafer behaves like a normal wafer which lacks pre-existing oxygen precipitate nucleation centers when the wafer is subjected to this oxygen precipitation heat-treatment; that is, oxygen clustering is not observed and some out-diffusion of oxygen occurs. As the temperature is increased above 800° C., or if the temperature remains constant, the clusters in the vacancy rich zone grow into precipitates and are thereby consumed. By dividing the wafer into various zones of vacancy concentration, a template is effectively created through which is written an oxygen precipitate pattern which is fixed the moment the wafer is loaded into the furnace for an oxygen-precipitation heat-treatment.

In this regard it is to be noted that, while the heat treatments employed in the rapid thermal anneal process may result in the out-diffusion of a small amount of oxygen from the surface of the front and back surfaces of the wafer, the wafer bulk will have a substantially uniform oxygen concentration as a function of depth from the silicon surface. For example, the wafer will have a uniform concentration of oxygen from the center of the wafer to regions of the wafer which are within about 15 micrometers of the silicon surface, more preferably from the center of the silicon to regions of the wafer which are within about 10 micrometers of the silicon surface, even more preferably from the center of the silicon to regions of the wafer which are within about 5 micrometers of the silicon surface and most preferably from the center of the silicon to regions of the wafer which are within 3 micrometers of the silicon surface. In this context, substantially uniform oxygen concentration shall mean a variance in the oxygen concentration of no more than about 50%, preferably no more than about 20% and most preferably no more than about 10%.

In this regard it is to be further noted that, in general, a denuded zone is a zone occupying the region near the surface of a wafer which has (i) an absence of oxygen precipitates in excess of the current detection limit (currently about $10^7$ oxygen precipitates/$cm^3$) and (ii) a low concentration of, and preferably an essential absence of oxygen precipitation centers which, upon being subjected to an oxygen precipitation heat-treatment, are converted to oxygen precipitates. The presence (or density) of oxygen precipitate nucleation centers cannot be directly measured using presently available techniques. They may be indirectly measured, however, if they are stabilized and oxygen precipitates are grown at these sites by subjecting the silicon to an oxygen precipitation heat treatment. As used herein, therefore, silicon having a low density of oxygen precipitate nucleation centers shall mean silicon which, upon being annealed at a temperature of 800° C. for four hours and then at a temperature of 1000° C. for sixteen hours, has less than about $10^8$ oxygen precipitates/$cm^3$. Similarly, silicon having an essential absence of oxygen precipitate nucleation centers shall mean silicon which, upon being annealed at a temperature of 800° C. for four hours and then at a temperature of 1000° C. for sixteen hours, has less than $10^7$ oxygen precipitates/$cm^3$.

C. Interstitial Oxygen Concentration

The rate of thermal donor formation has been found to have a dependence upon the interstitial oxygen concentration and temperature. In particular, the rate of thermal donor formation, expressed as d[TD]/dt, is proportional to the interstitial oxygen concentration raised to a power, expressed as $[O_i]^n$ wherein [TD] is the thermal donor concentration and $[O_i]$ is the interstitial oxygen concentration and the value of n increases with temperature. See Londos et al, *Appl. Phys. Lett.*, 62, 1525 (1993). For example, at an annealing temperature of about 450° C. (n=3.5) a wafer having an interstitial oxygen concentration of about 10 ppma will form approximately 10 times the number of thermal donors as a wafer having an interstitial oxygen concentration of about 5 ppma. Because of the strong dependence of "n" upon temperature, however, at an annealing temperature of about 500° C. (n=9), a wafer having an interstitial oxygen concentration of about 10 ppma will form approximately 500 times the number of thermal donors as a wafer having an interstitial oxygen concentration of about 5 ppma.

To avoid the formation of an unacceptable quantity of thermal donors, therefore, the interstitial oxygen concentration must be controlled before the wafer is subjected to a thermal treatment which yields the thermal donors. In one embodiment, the wafer has an initial interstitial oxygen concentration which is sufficiently low to avoid the undesirable formation of thermal donors but yet sufficient to allow the formation of bulk micro defects (to provide internal gettering) using the rapid thermal annealing process described above. For this purpose, the maximum permissible concentration of oxygen will depend upon the details of the application for which it is being used, but in some cases initial interstitial concentrations of as much as 11 or 10 ppma may be acceptable. For other applications, the initial interstitial oxygen concentration may be 9 ppma or less. In this case, no additional suppression of interstitial oxygen concentration (by oxygen precipitation) is required to avoid the undesirable formation of thermal donors.

In another embodiment, the wafer may have an initial interstitial oxygen concentration in an amount which would lead to thermal donor formation if no steps were actively taken to suppress interstitial oxygen concentration. As described previously, the interstitial oxygen concentration may be suppressed by installing a template for oxygen precipitation using a rapid thermal process as previously described, and subjecting the wafer to an oxygen precipitation heat treatment to reduce the interstitial oxygen concentration in the wafer bulk (and the denuded zone, if present). In general, greater annealing times are required as the interstitial oxygen concentration increases and as the number of sites for oxygen precipitation decreases. In addition, in one embodiment a denuded zone depth is selected which will enable the concentration of interstitial oxygen to be reduced to a target value level for an annealing time which is no greater than that required for the bulk to achieve the target value. The target value, in turn, is primarily a function of the device fabrication process to which the wafer will be subjected and, in particular, to the duration and temperature of the low temperature anneal to which the wafer will be subjected (i.e., the time the wafer will be exposed to a temperature within the range of, for example, about 350° C. and 500° C.).

As previously discussed, it is believed that interstitial oxygen atoms diffuse to growing oxygen precipitates and are lost from solution during this secondary anneal. This process efficiently reduces oxygen concentration in the wafer bulk where vacancy concentrations are high because the vacancy catalyzed oxygen precipitate density is high and the distance an oxygen atom must migrate is relatively small. Conversely, the vacancy concentration is low in the denuded zone region and the oxygen atoms must migrate relatively large distances to reach an oxygen precipitate and thus be removed from solution. The result is a decrease in the oxygen removal efficiency with increasing denuded zone depth and a concomitant potential for otherwise elevated oxygen concentration and thermal donor formation in a device manufacturing process. This may be problematic in wafers with oxygen concentrations in excess of about 10 ppma. However, in such cases, the depth of the denuded zone may be selectively reduced (by means described herein, such as by thermally annealing and cooling the wafer in an atmosphere containing a nitriding gas and an oxidizing gas), in order to place the contained oxygen in close proximity to oxygen precipitates, thereby effectively reducing the concentration to levels where thermal donor formation is sufficiently inhibited.

In one embodiment, the resulting wafer will have a generally well defined, precipitate-free denuded zone with an interstitial oxygen concentration of less than about 10 ppma or $5 \times 10^{17}$ atoms/cm$^3$ (e.g., less than about 9, 8, 7, 6 or even 5 ppma), a bulk precipitate density above the effective gettering threshold of about $1 \times 10^8$ cm$^{-3}$ (e.g., $1 \times 10^9$ cm$^{-3}$, $1 \times 10^{10}$ cm$^{-3}$ or more), and a resistivity in at least the surface layer or denuded zone greater than about 50 ohm cm, more preferably greater than 100 ohm cm (e.g., 200, 300, 400 or even 500 ohm cm) and, in some embodiments, more preferably a resistivity greater than about 1000, 1500 or even 2000 ohm cm.

In view of the foregoing, it can be seen that, advantageously, the high resistivity wafers of the present invention have a template for oxygen precipitation and a relatively low interstitial oxygen concentration (whether achieved by selecting a wafer sliced from an ingot having a relatively low oxygen concentration, by annealing the wafer to reduce the interstitial oxygen concentration after the template for oxygen precipitation is established, or by optionally controlling the denuded zone depth). As a result, the wafers will not form thermal donors in an amount to appreciably affect the resistivity of the wafers during a typical semiconductor device fabrication process. In addition, the wafers optionally have a denuded zone in the near-surface region and a desirable number of microdefects (oxygen precipitates) in the wafer bulk for internal gettering. Such wafers are suitable for use in various applications directly, or they may be used as a substrate or a component of some other wafer or device, as further described herein below.

D. Epitaxial Layer

In one embodiment of the present invention, an epitaxial layer may be deposited upon the surface of an ideal precipitating wafer having a relatively low interstitial oxygen concentration. The epitaxial layer will be formed by means conventionally known and used by those skilled in the art such as decomposition of a gas phase, silicon-containing composition. In a preferred embodiment of this invention, the surface of the wafer is exposed to an atmosphere comprising a volatile gas comprising silicon (e.g., $SiCl_4$, $SiHCl_3$, $SiH_2Cl_2$, $SiH_3Cl$ or $SiH_4$). The atmosphere also preferably contains a carrier gas (preferably $H_2$). In one embodiment, the source of silicon during the epitaxial deposition is $SiH_2Cl_2$ or $SiH_4$. If $SiH_2Cl_2$ is used, the reactor vacuum pressure during deposition preferably is from about 500 to about 760 Torr. If, on the other hand, $SiH_4$ is used, the reactor pressure preferably is about 100 Torr. Most preferably, the source of silicon during the deposition is $SiHCl_3$. This tends to be much cheaper than other sources. In addition, an epitaxial deposition using $SiHCl_3$ may be conducted at atmospheric pressure. This is advantageous because no vacuum pump is required and the reactor chamber does not have to be as robust to prevent collapse. Moreover, fewer safety hazards are presented and the chance of air or other gases leaking into the reactor chamber is lessened.

During the epitaxial deposition, the wafer surface preferably is maintained at a temperature sufficient to prevent the atmosphere comprising silicon from depositing polycrystalline silicon onto the surface a temperature of at least about 800° C., more preferably about 900° C., and most preferably about 1100° C. The rate of growth of the epitaxial deposition preferably is from about 0.5 to about 7.0 $\mu$m/min. A rate of from about 3.5 to 4.0 $\mu$m/min. may be achieved, for example, by using an atmosphere consisting essentially of about 2.5 mole % $SiHCl_3$ and about 97.5 mole % $H_2$ at a temperature of about 1150° C. and pressure of about 1 atm.

If desired, the epitaxial layer may additionally include a p-type or n-type dopant. For example, it is often preferable for the epitaxial layer to contain boron. Such a layer may be prepared by, for example, including $B_2H_6$ in the atmosphere during the deposition. The mole fraction of $B_2H_6$ in the atmosphere used to obtain the desired properties (e.g., resistivity) will depend on several factors, such as the amount of boron out-diffusion from the particular substrate during the epitaxial deposition, the quantity of p-type dopants and n-type dopants that are present in the reactor and substrate as contaminants, and the reactor pressure and temperature. For high resistivity applications, the dopant concentration in the epitaxial layer should be as low as practical.

In another embodiment of the present invention, the ideal precipitating wafer anneal is performed in an ambient selected to give a wafer wherein the formed denuded zone depth approaches zero and where precipitation occurs in close proximity to the wafer surface. Such an ambient may be, for example, a nitriding gas or a combination of nitriding and non-nitriding gasses. A high resistivity epitaxial layer containing a low precipitate concentration is next deposited on the wafer. The effective denuded zone depth will then be the thickness of the epitaxial layer.

E. Silicon on Insulator Structure

A silicon on insulator structure generally comprises a device layer, a handle wafer or supporting layer, and an insulating film or layer (typically an oxide layer) between the supporting layer and the device layer. Generally, the device layer is between about 0.5 and 20 micrometers thick. Silicon on insulator structures may be prepared using various techniques known in the art, as further described herein below.

If the support layer of the SOI structure comprises or is derived from a high resistivity silicon wafer of the present invention, preferably the high resistivity silicon wafer process will be carried out before the device layer of the SOI structure has been attached to the handle wafer (or, in the case of ion implantation processes, before implantation occurs). If the present process is carried out prior to formation of the SOI structure, it may be desirable to stabilize the oxygen precipitate nucleation centers in the handle wafer after the process is complete and before preparation of the SOI structure begins. Additionally, if this approach is employed, the oxygen precipitation heat treatment of step $S_3$ may, in some embodiments, be achieved during formation of the SOI structure (such as in the case of wafer bonding), provided the treatment time and temperature employed by the SOI process are sufficient for oxygen precipitate formation.

It is to be further noted, however, that the high resistivity silicon wafer process may also be performed after the SOI structure has been prepared. Without being held to any particular theory, it is believed that the SOI structure will behave as a typical single crystal silicon wafer, with the oxide layer acting as a free surface from which vacancies and self-interstitials may be injected and to which they may diffuse.

SOI structures may be prepared, for example, by the SIMOX process by subjecting the high resistivity wafer to an ion implantation process which, as noted above, is standard in the art. (See, e.g., U.S. Pat. No. 5,436,175 and *Plasma Immersion Ion Implantation for Semiconductor Processing*, Materials Chemistry and Physics 46 (1996) 132–139, both of which are incorporated herein by reference). In such a process, the ions are implanted into a silicon wafer substrate which is then subjected to a high temperature anneal to form a buried oxide, insulating layer. If, for example, oxygen ions are implanted, a buried insulating layer of silicon dioxide ($SiO_2$) is formed. If nitrogen atoms are implanted, a buried layer of silicon nitride ($Si_3N_4$) is formed. In such instances, the resulting SOI structure comprises a high resistivity device layer and an insulating layer. Because of the high temperature oxide formation anneal, typically about 1150° C. to about 1400° C., oxygen solubility exceeds the typical oxygen concentration in the wafer so that preexisting precipitates may dissolve back into interstitial oxygen. Hence the oxygen reduction secondary anneal is typically preformed following the SIMOX process. This embodiment, then, typically comprises: performing the rapid thermal anneal and cooling process on a single crystal silicon wafer having essentially any oxygen concentration attainable using Cz crystal pulling techniques; forming an oxide insulating layer in the wafer; and, performing a secondary anneal at a temperature in the range of 700° C. to about 1100° C.

SOI structures may also be prepared by bonding two wafers and removing a portion of one of the bonded wafers. For example, SOI structures can be prepared by the BESOI process, wherein the high resistivity wafer is bonded to another wafer, and then a substantial portion of one of the wafers is etched away using known wafer thinning techniques to obtain the device layer. (See, e.g., U.S. Pat. Nos. 5,024,723 and 5,189,500 which are incorporated herein by reference.) In this instance, the resulting SOI structure comprises (i) a high resistivity device layer, (ii) a handle wafer or supporting layer, and (iii) an insulating layer between the device layer and the support layer.

In an alternative wafer bonding approach, hydrogen or another ion is implanted into one of the wafers and, after the two wafers are bonded, the bonded composite is subjected to a force which causes the bonded composite to cleave at the implantation site. For example, a SOI structure may be prepared by (1) the implantation of ions (e.g., hydrogen, nitrogen, etc.) in a high resistivity silicon wafer by bombardment to produce a layer of gaseous microbubbles, while keeping the temperature below the temperature at which the gaseous microbubbles can escape therefrom by diffusion, (2) contacting the planar face of the wafer with a stiffener to form a bonded composite, and (3) subjecting the bonded composite to a thermal or mechanical stress which causes the high resistivity wafer to delaminate in the region of ion implantation. If thermal stress is used, the composite is heated to a temperature above that which the implantation of ions occurred in order to create a crystalline rearrangement and a pressure effect in the microbubbles resulting in a separation between the thin high resistivity semiconductor film and the majority of the substrate (See, e.g., U.S. Pat. No. 5,374,564 which is incorporated herein by reference). If the SOI structure is to comprise a high resistivity silicon stiffener, in one embodiment, the wafer is subjected to the ideal precipitating process described above before bonding to the planar face of the other wafer. In another embodiment, the low defect density silicon wafer may first be bound to a Czochralski-type single crystal silicon wafer, and then the entire SOI structure may be subjected to the ideal precipitating process described above.

Figure 3:
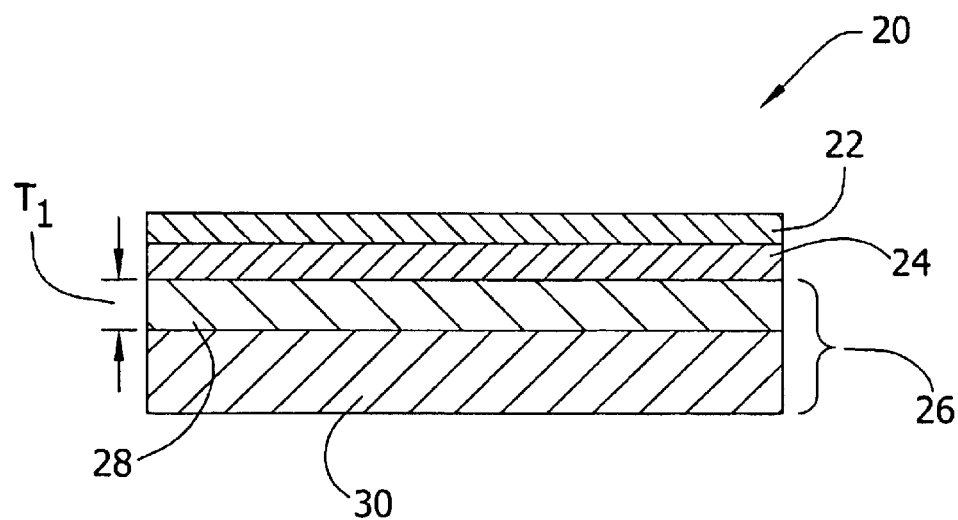
FIG. 3 is an illustration of a cross-section of a silicon on insulator structure, having a device layer, a supporting layer and an insulating layer there between, the supporting layer comprising a first stratum and a second stratum, the first stratum extending from the insulating layer to the second stratum and having a thickness, $T_1$, as measured from the insulating layer to the second stratum.

Accordingly, the silicon on insulator structures of the present invention are derived from a high resistivity silicon wafer of the present invention. More specifically:

1. Referring now to FIG. 3, in one embodiment, the SOI structure 20 comprises a device layer 22, a supporting layer 26 and an insulating layer 24 there between. The supporting layer 26 comprises (A) a first stratum 28 and a second stratum 30, the first stratum (i) having a greater resistivity than the second stratum, (ii) extending from the insulating layer to the second stratum, and (iii) having a thickness, $T_1$, as measured from the insulating layer to the second stratum, and (B) a non-uniform concentration of crystal lattice vacancies, the concentration of the vacancies in the second stratum being greater than the concentration of vacancies in the first stratum, wherein (i) $T_1$ is at least about 5 microns but less than about 30 microns, (ii) the first stratum has a resistivity of greater than about 50 ohm cm, and (iii) upon being subjected to an oxygen precipitation heat-treatment at a temperature in excess of about 700° C., the first stratum has an oxygen precipitate density of less than about $1 \times 10^7$ cm$^{-3}$ while the second stratum has an oxygen precipitate density of greater than about $1 \times 10^7$ cm$^{-3}$.

In alternative embodiments, $T_1$ may range from at least about 5 microns to less than about 25, 20, 15 or even 10 microns (e.g., from about 10 to 25 microns, or from about 15 to 20 microns).

Figure 4:
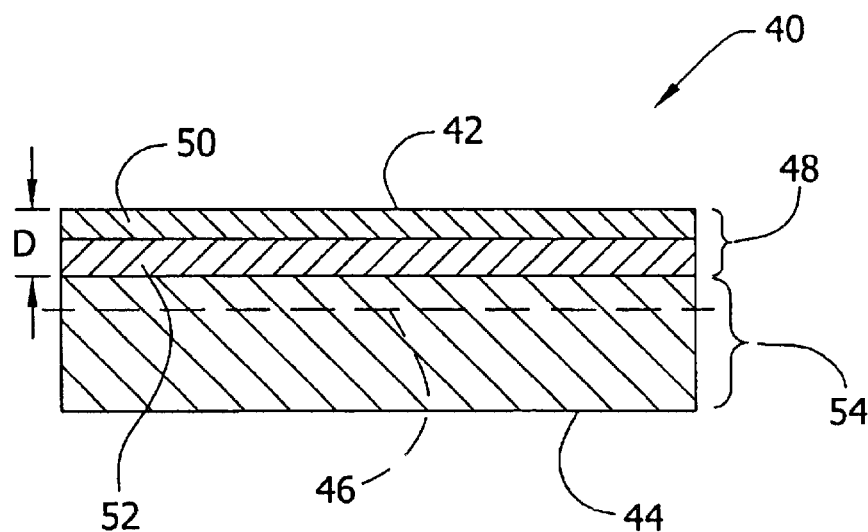
FIG. 4 is an illustration of a cross-section of a silicon on insulator structure having (i) a front surface, a back surface, an imaginary central plane approximately equidistant between the front and back surfaces, (ii) a surface stratum which comprises a region of the wafer between the front surface and a distance, $D_1$ measured from the front surface and toward the central plane, and which includes a device layer and an insulating layer, the device layer extending from the front surface to the insulating layer, and (iii) a bulk stratum which comprises the imaginary central plane but not the first stratum.

2. Referring now to FIG. 4, in a second embodiment, the SOI structure 40 comprises a silicon wafer, sliced from a single crystal silicon ingot grown in accordance with the Czochralski method. The silicon wafer has (A) a front surface 42, a back surface 44, an imaginary central plane 46 approximately equidistant between the front and back surfaces, (B) a surface stratum 48 which comprises a region of the wafer between the front surface and a distance, D, measured from the front surface and toward the central plane, and which includes a device layer 50 and an insulating layer 52, the device layer extending from the front surface to the insulating layer, (C) a bulk stratum 54 which comprises the imaginary central plane but not the first stratum, and (D) a non-uniform concentration of crystal lattice vacancies, the concentration of the vacancies in the bulk stratum being greater than the concentration of vacancies in the surface stratum, wherein (i) D is at least about 5 microns but less than about 30 microns, (ii) the surface stratum has a resistivity of greater than about 50 ohm cm, and (iii) upon being subjected to an oxygen precipitation heat-treatment at a temperature in excess of about 700° C., the surface stratum has an oxygen precipitate density of less than about $1 \times 10^7$ cm$^{-3}$ and the bulk stratum has an oxygen precipitate density of greater than about $1 \times 10^7$ cm$^{-3}$.

In alternative embodiments, D may range from at least about 5 microns to less than about 25, 20, 15 or even 10 microns (e.g., from about 10 to 25 microns, or from about 15 to 20 microns).

F. Additional Embodiments

It is to be noted that, in addition to the embodiments described herein above, the process generally described herein for controlling the vacancy concentration profile in a Czochralski-type single crystal silicon wafer may alternatively be used to prepare silicon wafers having at least a surface layer or region which has a high resistivity (e.g., at least about 50 ohm cm, 100 ohm cm, etc.) by, for example:

1. Thermally annealing the silicon wafer, as described herein, in an atmosphere of pure nitrogen, or some other purely nitriding gas, in order to obtain a substantially uniform, high vacancy concentration throughout the wafer; that is, such a thermal anneal may be utilized to obtain a wafer having a high vacancy concentration which is substantially constant from the front surface of the wafer to the back surface (assuming neither surface has been shielded in some way). Coupled with an oxygen precipitation heat-treatment and an appropriate epitaxial layer, or alternatively a device layer of some kind (such as in the case of a silicon on insulator structure), a wafer can be obtained which has a surface layer or region which is substantially free of oxygen precipitates and which has a high resistivity.

Alternatively, after thermally annealing in a nitriding atmosphere or ambient, and thus creating such a high vacancy concentration throughout the wafer, the wafer may be subjected to an anneal in an oxidizing atmosphere (either after the wafer has cooled or at temperature), thus altering the uniformly high vacancy profile by means of creating an inward flux of interstitials (as described herein), the vacancies being consumed through recombination.

2. Increasing the cooling rate after the thermal anneal, in order to achieve a thin (e.g., less than about 30 microns) denuded zone.

3. After thermally annealing and cooling the wafer to obtain a thick denuded zone (e.g., greater than about 30 microns), removing a portion thereof by means known in the art (e.g., wafer polishing). In such instances, if a sufficient portion (which can be determined by means known in the art) of the denuded zone is remove, the region having a high thermal donor concentration (after subjecting the wafer to a common thermal treatment to generate/annihilate thermal donors) may be removed, thus leaving behind a portion of the denuded zone nearest the bulk of the wafer wherein oxygen precipitates are present and which have consumed excess free or interstitial oxygen.

G. Wafer Characterization

The capacity of a wafer for thermal donor formation or the number of thermal donors which have been formed in a wafer during a previous heat-treatment may readily be determined in a two step heat-treatment process in which any pre-existing thermal donors are annihilated in a first step and thermal donors are then grown in a second step. The preferred two-step heat treatment process consists of a thermal donor annihilation step in which the wafer is annealed at 650° C. for one hour followed by a thermal donor generation step in which the wafer is annealed at 450° C. for one hour; when annealed in this sequence, at the indicated temperatures and for the indicated times, the wafers of the present invention will not form more than $10^{13}$ thermal donors/cm$^3$. Thermal donor annihilation provides a common baseline from which to measure the performance of the wafers; in this first step any thermal donors formed, for example, during a device fabrication process may be dissolved to become interstitial oxygen. In a second step, the wafers are subjected to a thermal donor generation anneal. In this step, interstitial oxygen forms thermal donors, with the number of donors formed being related to the wafer interstitial oxygen concentration.

EXAMPLES

The following examples will illustrate the various features of the present invention.

Example 1

Figure 2:
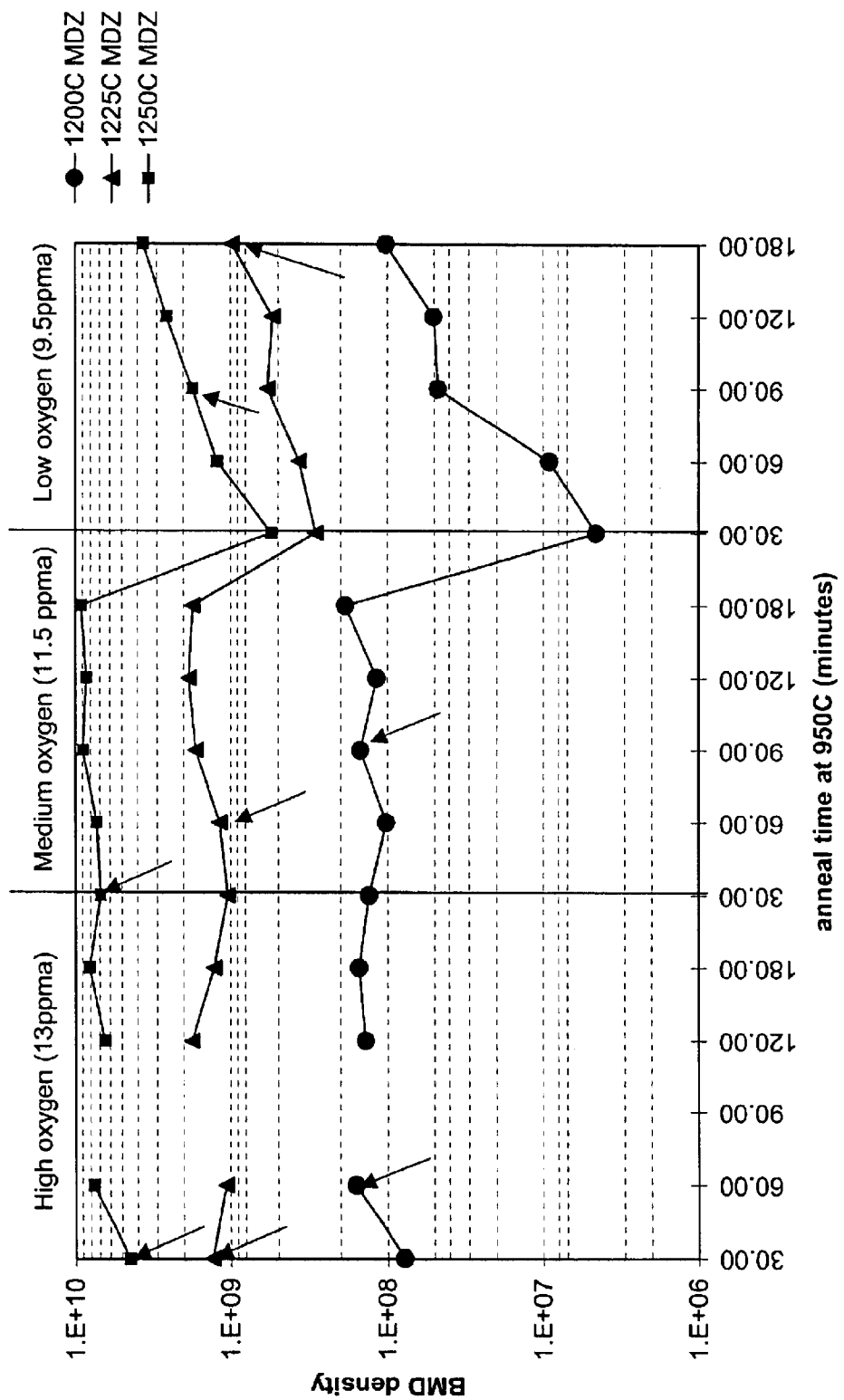
FIG. 2 is a graphical depiction of a wafer bulk precipitate density versus secondary anneal temperature for three different oxygen ranges as a function of anneal time (e.g., wafers having oxygen concentrations of 13 ppma, 11.5 ppma and 9.5 ppma, annealed at 950° C. for 0.5, 1, 1.5, 2 and 3 hours, followed by 16 hours at 1000° C.).

Example 1 and FIG. 2 demonstrate the gettering capability of ideal precipitating wafers over a range of oxygen concentration. In the first set of experiments, ideal precipitating wafers with an oxygen concentration of 13 ppma were produced at a step $S_1$ heat treatment temperature of 1200° C., followed by oxygen bulk precipitate growth at 950° C. over a range of 30 minutes to 180 minutes. The evaluations were repeated for 1225° C. and 1250° C. step $S_1$ heat treatment temperatures. In a second and third set of experiments, the first set of experiments were repeated for ideal precipitating wafers with oxygen concentrations of 11.5 ppma and 9.5 ppma respectively. Gettering capability was measured by contaminating the wafer back surface with nickel. The arrows in FIG. 2 indicate the onset of complete gettering. The data show that bulk precipitate density above the threshold for effective gettering may be obtained for ideal precipitating wafers over a range of oxygen concentration, and even in the case of low oxygen concentration.

Example 2

Four wafers were cut from two sections of a high resistivity CZ crystal. Three wafers were given ideal precipitating wafer heat-treatments at 1235° C., 1250° C. and 1275° C., respectively. The fourth wafer was a control that was not given an ideal precipitating wafer heat-treatment. Each wafer was then quartered and given the following secondary anneals:

| Wafer GG, Quarter 1 (GGQ1): | 4 hours at 800° C. followed by 16 hours at 1000° C.; |
|---|---|
| Wafer GG, Quarter 2 (GGQ2): | 8 hours at 800° C. followed by 16 hours at 1000° C.; |
| Wafer GG, Quarter 3 (GGQ3): | ramp from 800° C. to 1000° C. at 1° C./min followed by 1 hour at 1000° C.; and |
| Wafer GG, Quarter 4 (GGQ4): | ramp from 800° C. to 1000° C. at 2° C./min followed by 1 hour at 1000° C. |

Following the secondary anneals, the BMD density was measured by OPP (Optical Precipitate Profiler). The OPP method is an applied method of Normalski type differential interference microscope. In the method, laser beam from light source is separated to two orthogonal polarized straight beams of which phases are 90 degree different from each other through use of a polarizing prism, which then enter the wafer from the side of mirror polished surface. At this time, when one of the beams crosses a defect, phase shift occurs to form phase contrast with the other beam. The defect is detected by detecting the phase contrast with a polarization analyzer after the beams transmit from the back surface of the wafer. The results are shown in the table below.

| Wafer | BMD Density/cm$^3$ |
|---|---|
| GG Control Q1 | $3.9 \times 10^8$ |
| GG Control Q2 | $1.3 \times 10^8$ |
| GG Control Q3 | $2.5 \times 10^8$ |
| GG Control Q4 | — |
| GGQ1 (1235) | $6.7 \times 10^9$ |
| GGQ2 (1235) | $8.0 \times 10^9$ |
| GGQ3 (1235) | $2.5 \times 10^7$ |
| GGQ4 (1235) | $2.9 \times 10^7$ |
| GGQ1 (1250) | $9.3 \times 10^9$ |
| GGQ2 (1250) | $1.1 \times 10^{10}$ |
| GGQ3 (1250) | $4.9 \times 10^8$ |
| GGQ4 (1250) | $4.5 \times 10^7$ |
| GGQ1 (1275) | $1.2 \times 10^{10}$ |
| GGQ2 (1275) | $1.1 \times 10^{10}$ |
| GGQ3 (1275) | $3.0 \times 10^8$ |
| GGQ4 (1275) | $6.7 \times 10^7$ |

The control wafers did not receive an ideal precipitating wafer treatment thus the precipitate density following the thermal cycles is due to pre-existing precipitates which grew during the various thermal cycles. For wafers subjected to an ideal precipitating wafer treatment, there is a large difference in BMD density between the Q1 and Q2 (fixed temperature 800° C.+1000° C.) anneals as compared to the Q3 and Q4 (ramped temperature) anneals. The 800° C.+1000° C. anneals were efficient in growing the BMDs to a size where they are detectable by OPP. In contrast, the ramped anneals from 800° C. to 1000° C. were not very efficient at growing the precipitates. The results also indicate that the BMD density after the 800° C.+1000° C. anneal increases with increasing ideal precipitating wafer anneal temperature.

Example 3

The radial initial and final oxygen concentration ($O_i$) of the annealed GG wafers from Example 2, a second set of wafers (GA) prepared as in example 2, and corresponding untreated GG and GA wafers was determined. The results, reported in $O_i$ (ppma) at radial distances from the wafer (mm) for the annealed wafers with the indicated ideal precipitating wafer treatment temperature in parentheses, are given in the table below.

| Wafer | 10 mm | 30 mm | 50 mm | 70 mm | 90 mm |
|---|---|---|---|---|---|
| GG initial | 12.2 | 12.1 | 12.0 | 11.9 | 11.5 |
| GA initial | 11.2 | 11.0 | 10.9 | 10.9 | 10.5 |
| GGQ1 (1235) | 9.0 | 8.6 | 8.7 | 8.9 | 9.0 |
| GGQ2 (1235) | 7.9 | 7.5 | 7.6 | 7.8 | 8.1 |
| GGQ3 (1235) | 12.0 | 12.0 | 11.9 | 11.7 | 11.5 |
| GGQ4 (1235) | 12.6 | 12.0 | 12.0 | 11.9 | 11.6 |
| GAQ1 (1235) | 9.5 | 9.0 | 9.1 | 9.1 | 9.2 |
| GAQ2 (1235) | 8.3 | 8.0 | 8.2 | 8.3 | 8.6 |
| GAQ3 (1235) | 11.1 | 11.0 | 10.8 | 10.8 | 10.4 |
| GAQ4 (1235) | 11.1 | 11.0 | 10.8 | 10.8 | 10.5 |
| GGQ1 (1250) | 7.6 | 7.4 | 7.4 | 7.6 | 8.0 |
| GGQ2 (1250) | 6.1 | 5.9 | 5.9 | 6.0 | 6.5 |
| GGQ3 (1250) | 12.2 | 12.0 | 12.0 | 11.9 | 11.5 |
| GGQ4 (1250) | 12.2 | 12.1 | 12.1 | 12.0 | 11.5 |
| GAQ1 (1250) | 8.5 | 8.2 | 8.3 | 8.4 | 8.6 |
| GAQ2 (1250) | 6.9 | 6.6 | 6.6 | 6.8 | 7.3 |
| GAQ3 (1250) | 11.0 | 10.9 | 10.9 | 10.8 | 10.5 |
| GAQ4 (1250) | 11.1 | 10.9 | 11.0 | 10.9 | 10.5 |
| GGQ1 (1275) | 5.7 | 5.4 | 5.6 | 5.8 | 6.0 |
| GGQ2 (1275) | 4.1 | 4.0 | 4.2 | 4.4 | 4.5 |
| GGQ3 (1275) | 12.2 | 12.0 | 11.8 | 11.7 | 11.6 |
| GGQ4 (1275) | 12.4 | 12.3 | 12.1 | 11.9 | 11.8 |
| GAQ1 (1275) | 6.9 | 6.8 | 6.9 | 7.0 | 7.3 |
| GAQ2 (1275) | 5.1 | 5.0 | 5.1 | 5.3 | 5.6 |
| GAQ3 (1275) | 11.0 | 10.9 | 10.9 | 10.8 | 10.5 |
| GAQ4 (1275) | 11.2 | 11.0 | 10.9 | 10.8 | 10.5 |

The 800° C. to 1000° C. ramped anneals (Q3 and Q4) are not very efficient in growing the precipitates formed during the ideal precipitating wafer process, resulting in very little removal of interstitial oxygen from solution. In contrast, the two step 800° C. and 1000° C. anneals (Q1 and Q2) are much more effective in growing the precipitates formed during the ideal precipitating wafer process and in removing interstitial oxygen from solution. Further, the 8 hour/800° C. anneal is more effective at interstitial oxygen removal than the 4 hour/800° C. anneal. Moreover, the final $O_i$ after the two step anneal decreases with increasing ideal precipitating wafer high temperature anneal temperature. Finally, the data show that the final $O_i$ is a function of the initial $O_i$, with a higher initial $O_i$ providing greater supersaturation which leads to a greater amount of removal of interstitial oxygen from solution during the secondary anneals.

Example 4

The final resistivity of the wafers as prepared in example 2 was evaluated following a two hour anneal at 450° C. and reported in the table below. The resistivity of the wafer before any anneals were done was 4000 ohm-cm. The last column is the thermal donor concentration, reported as thermal donors/cm$^3$ ([TD]/cm$^3$), generated after one hour at 450° C. as calculated from the 2 hour resistivity data. The thermal donor concentration at one hour was calculated form the resistivity data by assuming that the thermal donors are double donors (see M. Claybourn and R. C. Newman, Appl. Phys. Lett., 2139, 1988). Initially, the thermal donors compensate the boron acceptors, but after longer times the concentration of thermal donors, [TD], will be greater than the boron concentration. At this point, the resistivity changes to n-type. By using a standard conversion chart for converting between resistivity and dopant density, such as that given in ASTM standard F723-88, it is possible, assuming that the dopant concentration is phosphorous for n-type material or boron for p-type material, to calculate the corresponding dopant concentration and then halving this value to obtain the corresponding thermal donor concentration. The thermal donor concentration is therefore obtained from: (initial dopant concentration (assuming p-type; boron)+final dopant concentration (assuming n-type; phosphorous))×0.5.

| Wafer | 2 Hour Resistivity (ohm − cm) | 1 Hour [TD]/cm$^3$ |
|---|---|---|
| GG Control Q1 | 35.0 | $4.0 \times 10^{13}$ |
| GG Control Q2 | 41 | $2.9 \times 10^{13}$ |
| GG Control Q3 | 29 | $4.1 \times 10^{13}$ |
| GG Control Q4 | 27 | $4.4 \times 10^{13}$ |
| GGQ1 (1235) | 228 | $5.8 \times 10^{12}$ |
| GGQ2 (1235) | 272 | $4.9 \times 10^{12}$ |
| GGQ3 (1235) | 29 | $4.3 \times 10^{13}$ |
| GGQ4 (1235) | 29 | $4.2 \times 10^{13}$ |
| GGQ1 (1250) | 317 | $4.3 \times 10^{12}$ |
| GGQ2 (1250) | 342 | $4.1 \times 10^{12}$ |
| GGQ3 (1250) | 29 | $4.2 \times 10^{13}$ |
| GGQ4 (1250) | 29 | $4.1 \times 10^{13}$ |
| GGQ1 (1275) | 449 | $3.3 \times 10^{12}$ |
| GGQ2 (1275) | 515 | $2.9 \times 10^{12}$ |
| GGQ3 (1275) | 29 | $4.0 \times 10^{13}$ |
| GGQ4 (1275) | 28 | $4.3 \times 10^{13}$ |

The data demonstrate that the number of thermal donors generated during the 450° C. anneal is a strong function of the oxygen remaining in solution ($O_i$) immediately prior to the thermal donor anneals. The ideal precipitating wafer process in conjunction with a secondary anneal (such as 4 hr or 8 hr at 800° C. followed by a 16 hr/1000° C. anneal), is very effective in removing oxygen from solution and in limiting the number of thermal donors produced during the 450° C. anneals. The number of thermal donors produced was almost equivalent to the non-ideal precipitating wafer wafers. The final $O_i$ is a function of the ideal precipitating wafer process annealing temperature; a higher ideal precipitating wafer high temperature anneal temperature results in a higher BMD density, with the result that there are more BMDs to consume interstitial oxygen during the secondary anneals. The initial $O_i$ has little effect in determining the final $O_i$ of the wafer after secondary anneals and in the number of thermal donors produced during the 450° C. anneals.

Example 5

To demonstrate that the thermal donor concentration, thus final resistivity, is a strong function of the $O_i$ immediately prior to the 450° C. anneal, the concentration of thermal donors produced during the 450° C. anneals was measured as a function of the pre-anneal $O_i$. The results, reported as thermal donors/cm$^3$, are given in the table below.

| Pre Anneal $O_i$ | Q1 anneal | Q2 anneal | Q3 anneal | Q4 anneal |
|---|---|---|---|---|
| 4.1 | — | $2.9 \times 10^{12}$ | — | — |
| 5.1 | — | $3.4 \times 10^{12}$ | — | — |
| 5.7 | $3.3 \times 10^{12}$ | — | — | — |
| 6.1 | — | $4.1 \times 10^{12}$ | — | — |
| 6.9 | $3.0 \times 10^{12}$ | — | — | — |
| 7.6 | $4.3 \times 10^{12}$ | — | — | — |
| 7.9 | — | $5.0 \times 10^{12}$ | — | — |
| 8.4 | $7.5 \times 10^{12}$ | $4.8 \times 10^{12}$ | — | — |
| 9.1 | $5.8 \times 10^{12}$ | — | — | — |
| 9.5 | $1.2 \times 10^{13}$ | — | — | — |
| 10.9 | — | $2.4 \times 10^{13}$ | — | — |
| 11.1 | — | — | $3.0 \times 10^{13}$ | $3.0 \times 10^{13}$ |
| 11.2 | $2.8 \times 10^{13}$ | — | $3.1 \times 10^{13}$ | $2.9 \times 10^{13}$ |
| 11.5 | — | — | — | $3.0 \times 10^{13}$ |
| 11.9 | $3.1 \times 10^{13}$ | $2.9 \times 10^{13}$ | — | — |
| 12.0 | — | — | $4.3 \times 10^{13}$ | — |
| 12.2 | — | $4.1 \times 10^{13}$ | — | — |
| 12.4 | — | — | $4.3 \times 10^{13}$ | — |
| 12.6 | — | — | — | $4.2 \times 10^{13}$ |

Example 6

This example illustrates the trend that may be observed in the depth of the denuded zone resulting from an increase in the oxygen concentration in the ambient atmosphere employed in a standard ideal precipitating wafer thermal cycle at a $S_1$ temperature of 1250° C. (15 second anneal). The wafers in Set A were annealed in an argon/nitrogen/oxygen-containing atmosphere, and the wafers in Set B were annealed in a nitrogen/oxygen-containing atmosphere (the partial pressure of oxygen varying). After the process was complete, BMD density and denuded zone depth were determined by means known in the art. The results are given in the table below.

| Wafer Set | $O_2$ partial pressure (ppma) | DZ depth (microns) |
|---|---|---|
| A | 0 | 4 |
| A | 40 | 9 |
| A | 100 | 15 |
| A | 200 | 32 |
| A | 400 | 64 |
| A | 1000 | 74 |
| A | 2000 | 80 |
| B | 0 | 7 |
| B | 40 | 4 |
| B | 100 | 4 |
| B | 200 | 7 |
| B | 400 | 53 |
| B | 1000 | 60 |
| B | 2000 | 75 |

The data show that a combination of nitrogen/oxygen, or argon/nitrogen/oxygen may be used as the annealing (and optionally cooling) ambient during ideal precipitating wafer treatment to produce wafers of predetermined DZ depth; stated another way, the results show that the denuded zone depth may be "tuned" by adjusting the concentration of oxygen in the atmosphere (the denuded zone depth decreasing as the oxygen content increases).

Additionally, it is to be noted that results from these experiments (not shown) also indicate that even a small partial pressure of nitrogen (e.g., less than about 5%, 3% or even 2%) in an argon atmosphere, when no oxygen is present, results in no denuded zone. Therefore, a partial pressure of nitrogen in argon can range from less than about 1% to about 100%. However, experience to-date suggests a concentration of about 25% to 75% nitrogen in argon may allow for the most precise control of denuded zone depth (in combination with a controlled oxygen concentration).

In view of the above, it will be seen that the several objects of the invention are achieved. As various changes could be made in the above compositions and processes without departing from the scope of the invention, it is intended that all matter contained in the above description be interpreted as illustrative and not in a limiting sense.

What is claimed is:

1. A wafer sliced from a single crystal silicon ingot grown in accordance with the Czochralski method, the wafer comprising:

a front surface, a back surface, an imaginary central plane approximately equidistant between the front and back surfaces, a front surface layer which comprises a region of the wafer between the front surface and a distance, $D_1$, measured from the front surface and toward the central plane, and a bulk layer which comprises the imaginary central plane but not the front surface layer, and a non-uniform concentration of crystal lattice vacancies, the concentration of the vacancies in the bulk layer being greater than the concentration of vacancies in the front surface layer, wherein (i) $D_1$ is at least 5 microns but less than 30 microns, (ii) the surface layer has a resistivity of at least 100 ohm cm, and (iii) upon being subjected to an oxygen precipitation heat-treatment at a temperature in excess of about 700° C., the surface layer has less than about $1 \times 10^7$ cm$^{-3}$ oxygen precipitates while the bulk layer has more than about $1 \times 10^7$ cm$^{-3}$ oxygen precipitates.

2. The wafer of claim 1 wherein $D_1$ is greater than 5 microns and less than 25 microns.

3. The wafer of claim 1 wherein $D_1$ is greater than 5 microns and less than 20 microns.

4. The wafer of claim 1 wherein $D_1$ is greater than 5 microns but less than 15 microns.

5. The wafer of claim 1 wherein the surface layer has a resistivity of greater than 200 ohm cm.

6. The wafer of claim 1 wherein the surface layer has an interstitial oxygen concentration of less than about 10 ppma.

7. The wafer of claim 1 wherein, upon being subjected to a two-step heat-treatment consisting of a thermal donor annihilation step in which the wafer is annealed at about 650° C. for about one hour followed by a thermal donor generation step in which the wafer is annealed at about 450° C. for about one hour, the surface layer has a thermal donor density less than about $10^{13}$ cm$^{-3}$.

8. The wafer of claim 1 wherein the wafer further comprises an epitaxial layer on the front surface.

9. The wafer of claim 1 wherein the bulk layer has more than about $1 \times 10^8$ cm$^{-3}$ oxygen precipitates.

10. A silicon on insulator structure comprising a device layer, a supporting layer and an insulating layer there between, the supporting layer comprising a first stratum and a second stratum, the first stratum (i) having a greater resistivity than the second stratum, (ii) extending from the insulating layer to the second stratum, and (iii) having a thickness, $T_1$, as measured from the insulating layer to the second stratum, and a non-uniform concentration of crystal lattice vacancies, the concentration of the vacancies in the second stratum being greater than the concentration of vacancies in the first stratum, wherein (i) $T_1$ is at least 5 microns but less than 30 microns, (ii) the first stratum has a resistivity of at least 100 ohm cm, and (iii) upon being subjected to an oxygen precipitation heat-treatment at a temperature in excess of about 700° C., the first stratum has an oxygen precipitate density of less than about $1 \times 10^7$ cm$^{-3}$ while the second stratum has an oxygen precipitate density of greater than about $1 \times 10^7$ cm$^{-3}$.

11. The silicon on insulator structure of claim 10 wherein $T_1$ is greater than 5 microns and less than 25 microns.

12. The silicon on insulator structure of claim 10 wherein the first stratum has a resistivity of greater than about 500 ohm cm.

13. The silicon on insulator structure of claim 10 wherein the first stratum has an interstitial oxygen concentration of less than about 10 ppma.

14. The silicon on insulator structure of claim 10 wherein the insulating layer consists essentially of implanted ions.

15. The silicon on insulator structure of claim 14 wherein said implanted ions are oxygen or nitrogen.

16. A silicon on insulator structure comprising a silicon wafer, sliced from a single crystal silicon ingot grown in accordance with the Czochralski method, having (i) a front surface, a back surface, an imaginary central plane approximately equidistant between the front and back surfaces, (ii) a surface stratum which comprises a region of the wafer between the front surface and a distance, D, measured from the front surface and toward the central plane, and which includes a device layer and an insulating layer, the device layer extending from the front surface to the insulating layer, (iii) a bulk stratum which comprises the imaginary central plane but not the first stratum, and (iv) a non-uniform concentration of crystal lattice vacancies, the concentration of the vacancies in the bulk stratum being greater than the concentration of vacancies in the surface stratum, wherein (a) D is at least 5 microns but less than 30 microns, (b) the surface stratum has a resistivity of at least 100 ohm cm, and (c) upon being subjected to an oxygen precipitation heat-treatment at a temperature in excess of about 700° C., the surface stratum has an oxygen precipitate density of less than about $1 \times 10^7$ cm$^{-3}$ and the bulk stratum has an oxygen precipitate density of greater than about $1 \times 10^7$ cm$^{-3}$.

17. The silicon on insulator structure of claim 16 wherein the insulating layer comprises implanted ions.

18. The silicon on insulator structure of claim 17 wherein the ion layer is composed of oxygen or nitrogen.

19. The silicon on insulator structure of claim 17 wherein the insulating implanted ion layer within the surface stratum has a peak concentration less than 1000 angstroms beneath the front surface.

20. The silicon on insulator structure of claim 17 wherein the insulating implanted ion layer within the surface stratum has a peak concentration ranging from greater than about 250 angstroms to less than about 1000 angstroms.

21. The silicon on insulator structure of claim 17 wherein the insulating implanted ion layer within the surface stratum has a peak concentration ranging from greater than about 500 angstroms to less than about 750 angstroms.

22. The silicon on insulator structure of claim 16 wherein D is greater than 10 microns and less than 25 microns.

23. The silicon on insulator structure of claim 16 wherein the surface layer has an interstitial oxygen concentration of less than about 10 ppma.

24. The silicon on insulator structure of claim 16 wherein the bulk layer has an oxygen precipitate density of greater than about $1 \times 10^8$ cm$^{-3}$.

* * * * *